United States Patent
Kitaoka

(10) Patent No.: US 7,180,574 B2
(45) Date of Patent: Feb. 20, 2007

(54) EXPOSURE APPARATUS AND METHOD

(75) Inventor: Atsushi Kitaoka, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 11/088,160

(22) Filed: Mar. 23, 2005

(65) Prior Publication Data

US 2005/0213065 A1    Sep. 29, 2005

(30) Foreign Application Priority Data

Mar. 29, 2004    (JP)    ............... 2004-097137

(51) Int. Cl.
*G03B 27/42*    (2006.01)

(52) U.S. Cl. .................... 355/53; 355/67; 355/77; 378/34

(58) Field of Classification Search ............ None
See application file for complete search history.

(56) References Cited

U.S. PATENT DOCUMENTS

| 5,610,683 | A | 3/1997 | Takahashi |
| 5,688,364 | A | 11/1997 | Sato |
| 6,610,168 | B1 | 8/2003 | Miki et al. |

FOREIGN PATENT DOCUMENTS

| JP | 6-124873 | 5/1994 |
| JP | 8-8216 | 1/1996 |
| JP | 2753930 | 3/1998 |
| JP | 10-303114 | 11/1998 |
| JP | 10-303161 | 11/1998 |
| JP | 11-016815 | 1/1999 |
| JP | 11-054427 | 2/1999 |
| JP | 11-176727 | 7/1999 |
| JP | 99/49504 | 9/1999 |
| JP | 2000-216126 | 8/2000 |
| JP | 2001-250773 | 9/2001 |
| JP | 2002-248429 | 9/2002 |
| JP | 2003-031540 | 1/2003 |

OTHER PUBLICATIONS

Korean Patent Office Communication dated Jun. 22, 2006, w/English Translation of Examiner's Comments in Korean Office Action.
Taiwan Patent Office Communication dated Sep. 21, 2006 with English translation of Examiner's Comments in Taiwanese Office Action.

*Primary Examiner*—D. Rutledge
(74) *Attorney, Agent, or Firm*—Morgan & Finnegan, LLP

(57) ABSTRACT

An exposure apparatus includes a projection optical system for projecting an image of a pattern of a reticle onto an object, via a fluid that is filled in a space between said projection optical system and the object, a vibrator part for vibrating at least one of the fluid, the object, and the projection optical system, and a controller for controlling the vibrator part so that the vibration of at least one of the fluid, the object, and the projection optical system becomes a tolerance during a processing of the object.

9 Claims, 9 Drawing Sheets

EXPOSURE APPARATUS AND METHOD

BACKGROUND OF THE INVENTION

The present invention relates generally to an exposure apparatus and method used to fabricate various device including semiconductor chips such as ICs and LSIs, display devices such as liquid crystal panels, sensing devices such as magnetic heads, and image pickup devices such as CCDs, as well as fine patterns used for micromechanics, and more particularly to an immersion exposure apparatus (an immersion lithography exposure system) and method for exposing the object through the fluid between the projection optical system and the object.

A projection exposure apparatus has been conventionally used to transfer a circuit pattern on a reticle (or a mask) via a projection optical system onto a wafer etc, and the high-quality exposure at a high resolution has recently been increasingly demanded. The immersion exposure attracted people's attentions as one means that satisfies this demand. The immersion exposure promotes the higher numerical aperture ("NA") by replacing a medium (typically the air) at the wafer side of the projection exposure with fluid. The projection exposure apparatus has an NA=n·sinT where n is a refractive index of the medium, and the NA increases when the medium that has a refractive index higher than the air's refractive index, i.e., n>1.

For the immersion exposure, some methods have already been proposed to fill the fluid in the space between the object and the projection optical system (see, for example, International Publication No. WO99/49504.). International Publication No. WO99/49504 proposes to provide a fluid supply nozzle and a fluid recovery nozzle near a final lens in the projection optical system that is closest to a substrate, and supplies fluid from the fluid supply nozzle between the substrate and the final lens. The exposure is performed, while the fluid supply nozzle continuously supplies the fluid and the fluid recovery nozzle continuously recovers the fluid or while the fluid circulates between the substrate and the final lens. If new fluid is always supplied, it is desirable because there is little change in the transmittance and refractive index of the fluid even if a resist and an optical element begin to dissolve into the fluid.

The immersion exposure causes the air bubbles and the micro bubbles (these are only called "air bubbles" in this application) to mix into the fluid, when exposing the transfer area around the substrate and filling the fluid in the space between the substrate and the final lens. The air bubbles shield the exposure light, resulting in lowered transfer accuracy and yield, and cannot satisfy the demand for the high-quality exposure. The air bubbles would never be eliminated completely irrespective of the subsequent continuous supply and recovery of the fluid. Moreover, the air bubbles are generated from the fluid supply nozzle, and might mix with the continuously supplied fluid.

A method for immersing a chuck to fix the substrate to a stage as a driving part in the fluid, a method for immersing the chuck and the stage, and a method for filling in a wafer cassette that stores the wafer with the fluid, etc, are known as the other fluid supply methods (see, for example, Japanese Patent Application Publication No. 10-303114). However, it is a common problem for all the fluid supply methods to prevent the air bubbles being mixed with the fluid.

To solve this problem, a method for vibrating the fluid, the substrate, and the optical element of the projection optical system by irradiating an ultrasonic wave to the fluid and removing the air bubbles is proposed (see, for example, Japanese Patent No. 2753930, Japanese Patent Application Publication No. 11-176727, U.S. Pat. No. 5,610,683, Japanese Patent Application Publication No. 2001-250773, U.S. Pat. No. 6,610,168, Japanese Patent Application Publication No. 11-54427, Japanese Patent Application Publication No. 8-8216, Japanese Patent Application Publication No. 2003-31540, Japanese Patent Application Publication No. 2000-216126, Japanese Patent Application Publication No. 10-303161, and Japanese Patent Application Publication No. 2002-248429).

BRIEF SUMMARY OF THE INVENTION

These prior arts disclose techniques for effectively removing the air bubbles by ultrasonic wave irradiation. However, the present inventor discovered the transfer accuracy of the pattern to be deteriorating according to the vibration level by the ultrasonic wave. In detail, even if the vibration level by the ultrasonic wave is large, the transfer image on the wafer is blurred by the vibration and the transfer accuracy is deteriorated. Also, the error is caused by the vibration at the alignment detection in the XY direction and the focus detection in the Y direction, the overlapping error because of the alignment error and the image blur because of the focus error are generated, and the deterioration in the transfer accuracy is caused.

The present invention is directed to an exposure apparatus capable of effectively removing the air bubbles that exists in the fluid, and prevents the deterioration in the transfer accuracy.

An exposure apparatus of one aspect of the present invention includes a projection optical system for projecting an image of a pattern of a reticle onto an object, via a fluid that is filled in a space between said projection optical system and the object, a vibrator part for vibrating at least one of the fluid, the object, and the projection optical system, and a controller for controlling the vibrator part so that the vibration of at least one of the fluid, the object, and the projection optical system becomes a tolerance during a processing of the object.

An exposure method according to another aspect of the present invention that uses an exposure apparatus that includes a projection optical system for projecting a pattern of a reticle onto an object, and exposes the object via the projection optical system and a fluid between the projection optical system and the object. The exposure method includes the steps of a first step for acquiring a first information on a vibration allowed to the fluid, the object, and the project optical system during a processing of the object, a second step for acquiring a second information on a vibration necessary to remove an air bubble for each mount of unit that exists in the fluid, the object, and/or the projection optical system, a third step for acquiring a third information on an amount of the air bubble that can be generated in the fluid, the object, and/or the projection optical system, and a fourth step for controlling an operation mode of vibrator part that vibrates at least one of the fluid, the object, and the projection optical system based on the first to third information.

A device fabricating method according to still another aspect of the present invention includes the steps of exposing an object using an exposure apparatus, and performing a development process for the object exposed, wherein said exposure apparatus includes a projection optical system for projecting an image of a pattern of a reticle onto the object, via a fluid that is filled in a space between said projection optical system and the object, a vibrator part for vibrating at least one of the fluid, the object, and the projection optical system, and a controller for controlling the vibrator part so that the vibration of at least one of the fluid, the object, and the projection optical system becomes a tolerance during a processing of the object.

Other objects and further features of the present invention will become readily apparent from the following description of the preferred embodiments with reference to the accompanying drawings.

DETAILED DESCRIPTION OF THE PREFERRED EMBODIMENTS

Figure 1:
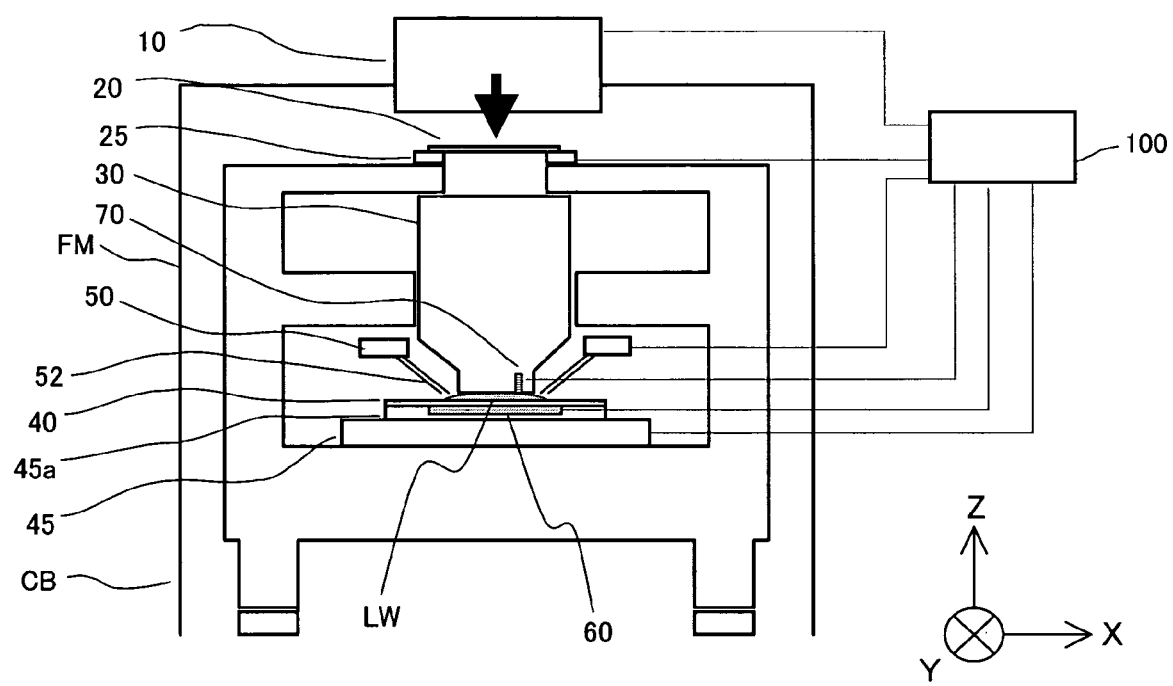
FIG. 1 is a schematic sectional view of an exposure apparatus as one aspect according to the present invention.

With reference to the accompanying drawings, a description will be given of an exposure apparatus 1 of one embodiment according to the present invention. In each figure, the same reference numeral denotes the same element. Therefore, duplicate descriptions will be omitted. FIG. 1 is a schematic sectional view of an exposure apparatus 1.

The exposure apparatus 1 is an immersion type exposure apparatus (an immersion lithography exposure system) that exposes onto an object 40 a circuit pattern created on a reticle 20 via a fluid LW supplied between a final surface at the object 40 side of a projection optical system 30 and the object 40 in a step-and-scan manner. The "step-and-scan manner", as used herein, is an exposure method that exposes a reticle pattern onto a wafer by continuously scanning the wafer relative to the reticle, and by moving, after an exposure shot, the wafer stepwise to the next exposure area to be shot.

The exposure apparatus 1 includes, as shown in FIG. 1, an illumination apparatus 10, the reticle 20, a reticle stage 25 that mounts the reticle 20, the projection optical system 30, a wafer stage 45 that mounts the object 40, a fluid supply-recovery mechanism 50, an ultrasonic wave irradiation mechanism 60, a vibration sensor 70, and a controller 100. The exposure apparatus 1 is covered with a chamber CB kept at constant atmosphere as shown in FIG. 1. A frame FM has the structure with a high rigidity, as described later, enables a highly accurate positioning of the reticle 20 and the object 40.

The illumination apparatus 10 illuminates the reticle 20, on which a circuit pattern to be transferred is formed, and includes a light source section (not shown) and an illumination optical system (not shown).

The light source section uses, as an example, a light source such as ArF excimer laser with a wavelength of approximately 193 [nm] and KrF excimer laser with a wavelength of approximately 248 [nm]. However, the laser type is not limited to excimer lasers because, for example, $F_2$ laser with a wavelength of approximately 157 [nm] may be used.

The illumination optical system is an optical system that illuminates the reticle 20 using the light from the light source (not shown), and includes a lens, a mirror, a light integrator, a stop, and the like, for example, a condenser lens, a fly-eye lens, an aperture stop, a condenser lens, a slit, and an image-forming optical system in this order. The light integrator may include a fly-eye lens or an integrator formed by stacking two sets of cylindrical lens array plates (or lenticular lenses), and can be replaced with an optical rod, a diffractive element, or a micro-lens-array.

The reticle 20 is transferred from the outside of the exposure apparatus 1 by a reticle transfer system (not shown), and is supported and driven by the reticle stage 25. The reticle 20 is made, for example, of quartz and forms a circuit pattern (or an image) to be transferred. Diffracted light from the pattern of the reticle 20 passes through the projection optical system 30 and is then projected onto the object 40. The reticle 20 and the object 40 are located in an optically conjugate relationship. The exposure apparatus 1 transfers the pattern from the reticle 20 to the object 40 by scanning the reticle 20 and the object 40 at the speed ratio of the reduction of the projection optical system 30.

The reticle stage 25 is attached at the frame FM. The reticle stage 25 supports the reticle 20 via a reticle chuck (not shown), and is connected to a moving mechanism (not shown). The moving mechanism includes a linear motor, etc., and moves the reticle 20 by driving the reticle stage 25 at least in a direction X.

The projection optical system 30 images the diffracted light passing through the pattern of the reticle 20 onto the object 40. The projection optical system 30 may use an optical system comprising solely of a plurality of lens elements, an optical system including a plurality of lens elements and at least one concave mirror (a catadioptric optical system), an optical system including a plurality of lens elements and at least one diffractive optical element such as a kinoform, a full mirror type optical system, and so on. Any necessary correction of the chromatic aberration may be accomplished by using a plurality of lens units made from glass materials having different dispersion values (Abbe values) or arranging a diffractive optical element such that it disperses light in a direction opposite to that of the lens unit.

The object 40 is transferred from the outside of the exposure apparatus 1 by a wafer transfer system (not shown), and is supported and driven by the wafer stage 45. The object 40 is, in the instant embodiment, a wafer, which includes a glass plate for the liquid crystal substrate and other objects. Photoresist is applied to the object 40.

The wafer stage 45 supports the object 40 via a wafer chuck 45a, and is connected to a moving mechanism (not shown). The moving mechanism uses, for example, a linear motor to move the object 40 in X-Y-Z directions. The wafer stage 45 moves a predetermined area of the object 40 right under the projection optical system and corrects the posture of the object 40. The reticle 20 and plate 40 are, for example, scanned synchronously, and the positions of the reticle stage 25 and the wafer stage 45 are monitored, for example, by a laser interferometer and the like, so that both are driven at a constant speed ratio.

The fluid supply-recovery mechanism 50 supplies the fluid LW between the projection optical system 30 and the object 40, which in detail means between the final optical element at the object 40 side of the projection optical system 30 (optical element arranged on the object 40 side final edge of the projection optical system 30) and recovers the supplied fluid LW, via a supply-recovery nozzle 52. In other words, the space formed on the projection optical system 30 and the surface of the object 40 is filled with the fluid LW supplied from the fluid supply-recovery mechanism 50.

The fluid LW is, in the instant embodiment, pure water. The space of the projection optical system 30 and the object 40 is about 100 μm. However, the fluid LW is not limited to pure water, can use a fluid that has high transmittance property and refractive index property for a wavelength of the exposure light, and high chemical stability to the projection optical system 30 and the photoresist spread on the object 40. For example, fluorine system inert fluid may be used. Moreover, the space of the projection optical system 30 and the object 40 is not limited to 100 μm.

The plural supply-recovery nozzles 52 of the fluid supply-recovery mechanism 50 are arranged around the object 40 on the bottom side edge of the projection optical system 30. In the instant embodiment, two supply-recovery nozzles 52 are arranged, but the number is not limited to this. The fluid supply-recovery mechanism 50 and supply-recovery nozzle 52 have the structure to use the supply and recovery of the fluid LW combinedly, are controlled in the controller 100 described later, and the supply and recovery of the fluid LW, or the switch of stop and the amount of supplied and recovered fluid LW are controlled based on condition of the driving direction of wafer stage 45 at the exposure. The fluid supply-recovery mechanism 50 has the function to circulate the fluid LW. When the fluid LW is made to circulate, there is a possibility that the air bubbles mixes with the fluid LW. Therefore, it is always desirable to irradiate the ultrasonic wave as described later. The present invention can be applied to not only the local fill type immersion exposure apparatus that is the above-mentioned but also the immersion exposure apparatus that immerses the chuck to fix the object to the stage in the fluid, immerses the chuck and the stage in the fluid, and fills in the cassette that stores the object with the fluid.

The ultrasonic wave irradiation mechanism 60 is arranged so that it is buried in the wafer chuck 45a, and irradiates the ultrasonic wave to the fluid LW. In other words, the ultrasonic wave irradiation mechanism 60 functions by the ultrasonic wave as a vibrator part that vibrates at least one of the fluid LW, the object 40, and the projection optical system 30. Concretely, the ultrasonic wave irradiation mechanism 60 is controlled by the controller 100 described later, and generates the ultrasonic wave based on the amplitude and the frequency instructed in from the controller 100. The generated ultrasonic wave is transmitted to the fluid LW through the object 40. When the air bubbles exists in the fluid LW, the air bubbles in the fluid LW inside can be eliminated by the vibration energy of the ultrasonic wave. However, if the ultrasonic wave irradiation mechanism 60 achieves the effect of eliminating the air bubble by giving the fluid LW the vibration energy, it does not limit to the instant embodiment and other embodiments are acceptable. For example, the ultrasonic wave irradiation mechanism 60 is not arranged in the inside of the wafer chuck 45a, and is acceptable to the structure in which the ultrasonic wave can be directly irradiated to the fluid LW.

The vibration sensor 70 is supported (attached) to the projection optical system 30, and detects the vibration of the fluid LW. The vibration sensor 70 does not limit to the vibration of the fluid LW, and has the function to detect at least one or more of the vibration of the projection optical system 30 by irradiation of the ultrasonic wave of the ultrasonic wave irradiation mechanism 60, the vibration of the object 40, and the vibration of the fluid LW. When the vibration sensor 70 detects the vibration of the projection optical system 30 or the vibration of the object 40, the controller 100 described later calculates the vibration of the fluid LW from the detection result.

The controller 100 includes a CPU and memory (not shown) and controls operation of the exposure apparatus 1. The controller 100 is electrically connected to the illumination apparatus 10, (the moving mechanism (not shown) for) the reticle stage 25, (the moving mechanism (not shown) for) the wafer stage 45, the fluid supply-recovery mechanism 50, the ultrasonic wave irradiation mechanism 60, and the vibration sensor 70. The CPU includes a processor regardless of its name, such as an MPU, and controls each module. The memory includes a ROM and RAM, and stores a firmware for controlling the operations of the exposure apparatus 1.

The controller 100 controls the ultrasonic wave irradiation mechanism 60 so that the vibration of the fluid LW when the object 40 is exposed (at exposure) may become a tolerance. In detail, the controller 100 adjusts at least one of the amplitude and the frequency of the ultrasonic wave irradiated by the ultrasonic wave irradiation mechanism 60 based on the vibration of the fluid LW detected by the vibration sensor 70. Concretely, the controller 100 acquires a first information concerning the vibration allowed to the fluid LW, the object 40, and the projection optical system 30, a second information concerning the vibration necessary to remove the air bubbles for each amount of unit that exists in the fluid LW, the object 40, and the projection optical system 30, and a third information concerning amount of the air bubbles that can be generated in the fluid LW, the object 40, and the projection optical system 30 when the object 40 is exposed, and controls the operation mode (in other words, irradiated ultrasonic wave) of the ultrasonic wave irradiation mechanism 60. The controller 100 controls the operation of the ultrasonic wave irradiation mechanism 60 so that the vibration of the fluid LW becomes an amount between the minimum vibration necessary to remove the air bubbles and the minimum vibration necessary at which transfer accuracy is not deteriorated.

Figure 2:
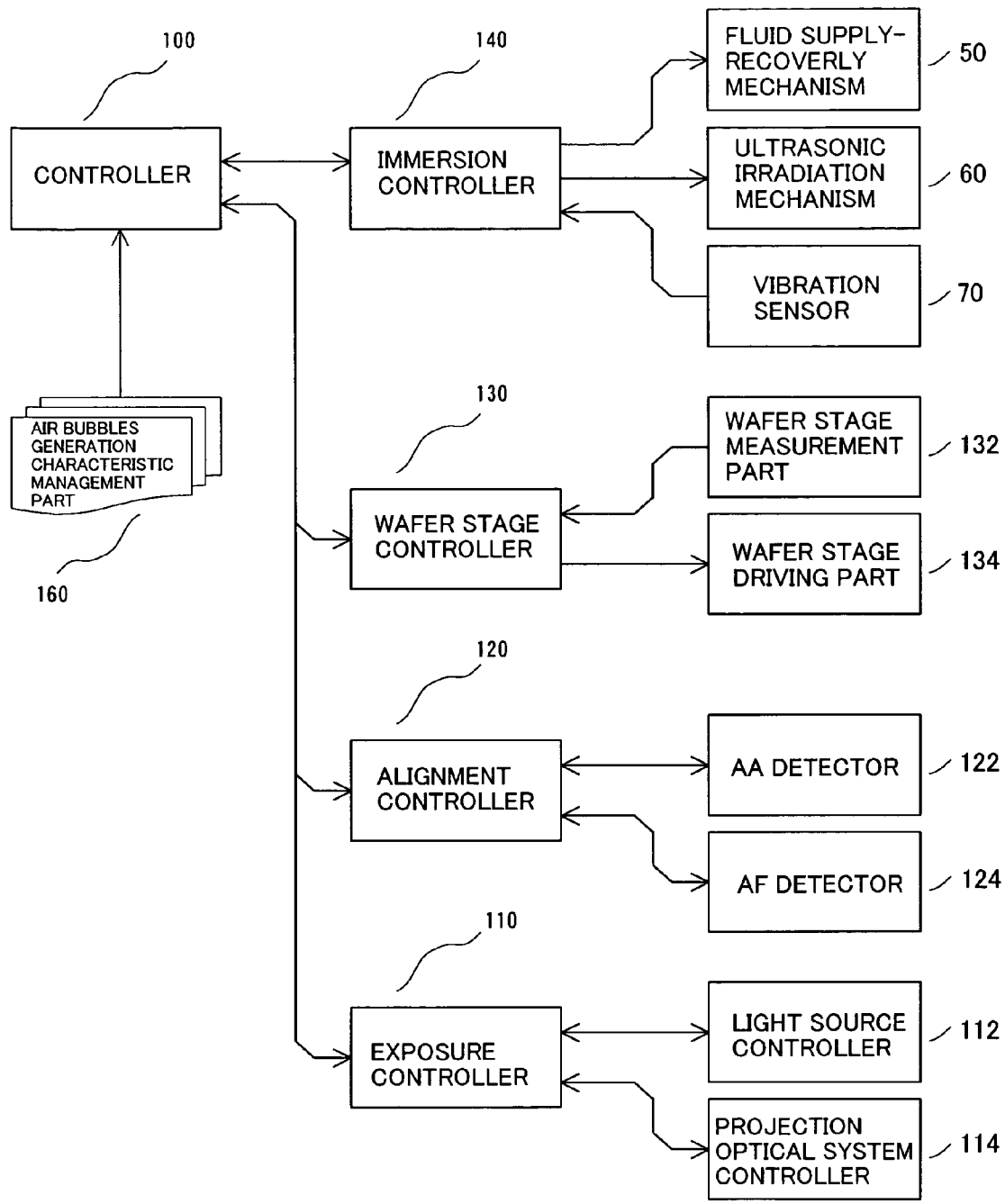
FIG. 2 is a view of module structure of a controller shown in FIG. 1.

The controller 100 has plural modules. The controller 100 of the instant embodiment includes, as shown in FIG. 2, an exposure controller 110, an alignment controller 120, a wafer stage controller 130, an immersion controller 140, and an air bubbles generation characteristic management part 160. Here, FIG. 2 is a view of module structure of the controller 100.

The exposure controller 110 includes a light source controller 112 and a projection optical system controller 114, and controls the exposure of the exposure apparatus 1. For example, the light source controller 112 controls an emitting timing and a light intensity of light emitted from the illumination apparatus 10, and the projection optical system controller 114 controls the drive of the optical element of the projection optical system 30 to correct the aberration of the projection optical system 30.

The alignment controller 120 includes an AA detector 122 and an AF detector 124, and controls the alignment of the reticle 20 and the object 40. The AA detector 122 detects the position of the horizontal direction of the reticle 20 and the object 40 (vertical plane to an optical axis). The AF detector 124 detects the position of the focus direction (the optical axis direction) of the reticle 20 and the object 40. The alignment controller 120 informs the controller 100 of the detection result of the AA detector 122 and the AF detector 124. At the exposure, the controller 100 controls the alignment of the reticle 20 and the object 40 based on the detection result of the horizontal direction and the focus direction through the reticle stage 25 and the wafer stage 45.

The wafer stage controller 130 includes a wafer stage measurement part 132 and a wafer stage driving part 134, and controls the drive of the wafer stage 45. The wafer stage measurement part 132 measures, for example, the position of the wafer stage 45 when the object 40 is scanned. The wafer stage driving part 134 scans the wafer stage 45 based on the measurement result of the wafer stage measurement part 132 to synchronize the reticle 20 and the object 40.

The immersion controller 140 controls the immersion exposure through the fluid supply-recovery mechanism 50, the ultrasonic wave irradiation mechanism 60 and the vibration sensor 70. In other words, the immersion controller 140 controls the switch of the supply and recovery of the fluid LW, stop, the amount of the supply and recovery of the fluid LW for the fluid supply-recovery mechanism 50. The immersion controller 140 instructs the ultrasonic wave irradiation mechanism 60 in the amplitude and the frequency based on the detection result of the vibration sensor 70. The immersion controller 140 has a function to calculate the vibration of the fluid LW from the vibration of the projection optical system 30 and/or the vibration of the object 40 detected by the vibration sensor 70.

The air bubbles generation characteristic management part 160 communicates to the controller 100 the rate of the generation of the air bubbles decided depending on each characteristic of the fluid LW, the final optical element at the object 40 side of the projection optical system 30, and the object 40 (the third information). For example, the rate of the generation of the air bubbles and a contact angle between the fluid LW and a solid surface (in other words, the final optical element at the object 40 side of the projection optical system 30 or the object 40 etc.) is obtained by the experiment beforehand. Next, the contact angle between the fluid LW, and the final optical element at the object 40 side of the projection optical system 30 or the object 40 used is measured, and the rate of the generation of the air bubbles is calculated from the result. The air bubbles generation characteristic management part 160 gives the controller 100 the vibration of the fluid LW can be allowed to the extent in which transfer accuracy is not deteriorated (the first information) and the vibration energy necessary to remove the air bubbles that exists in the fluid LW (the second information). This information are obtained by the experiment etc. beforehand. The air bubbles generation characteristic management part 160 may actually detect the rate of the generation of the air bubbles by using a database and an input means by man-machine interface, or the means to detect the generation of the air bubbles. The amplitude and the frequency of the ultrasonic wave irradiated to the immersion controller 140 are transmitted based on the information from the air bubbles generation characteristic management part 160.

Figure 3:
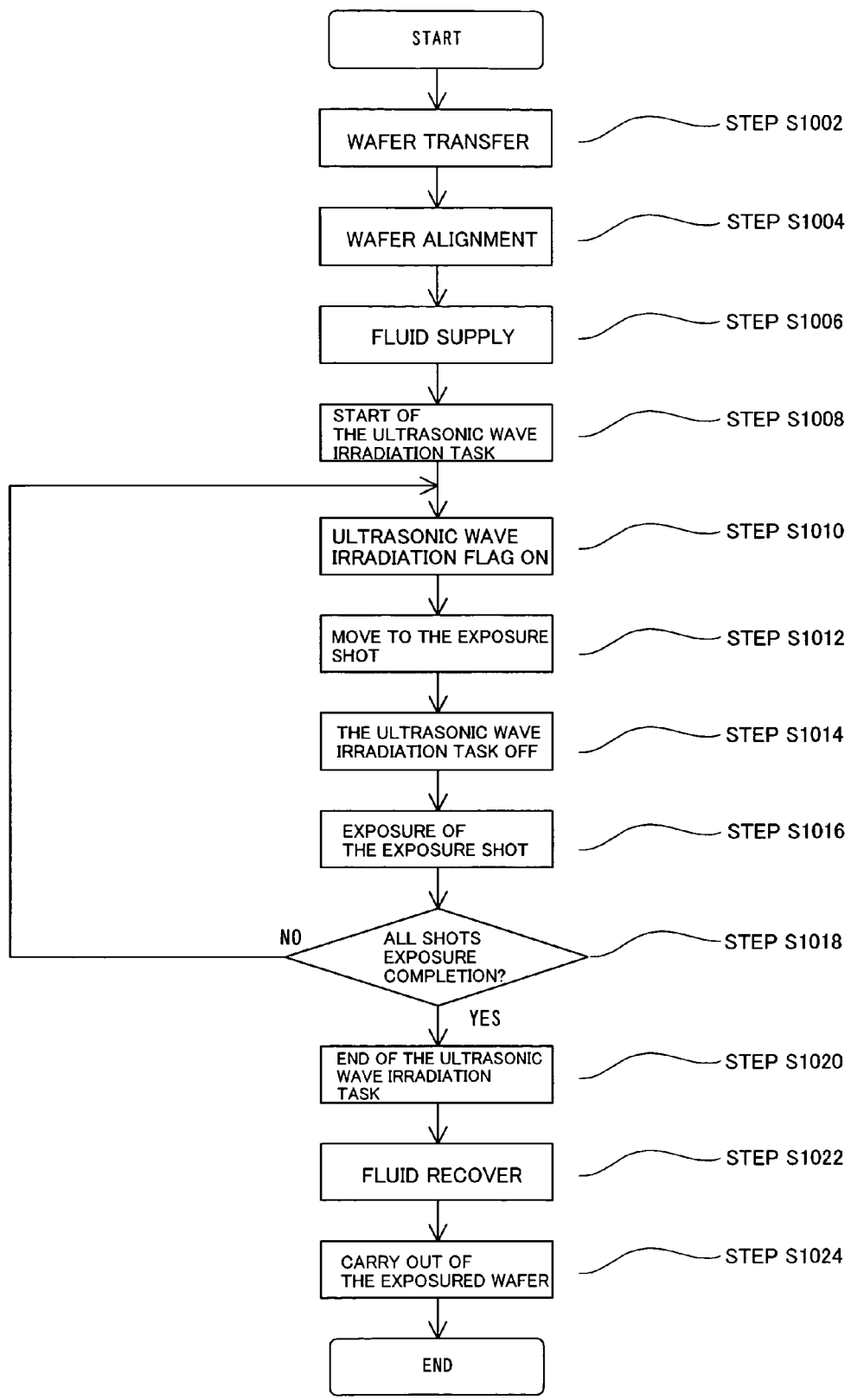
FIG. 3 is a flowchart for explaining operation of the exposure apparatus shown in FIG. 1.
Figure 4:
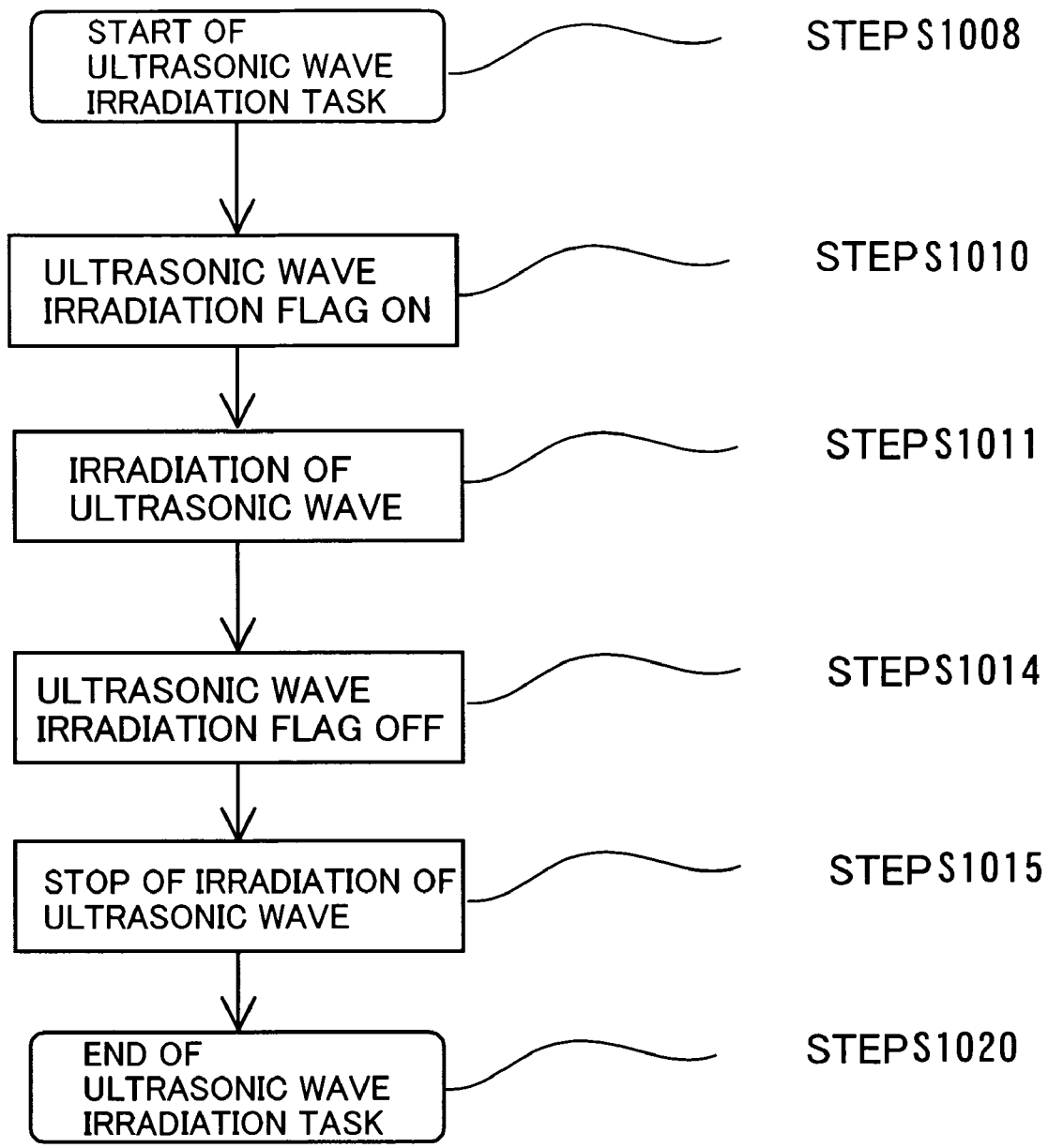
FIG. 4 is a detailed flowchart of an ultrasonic wave irradiation task in Step S1008 of FIG. 3.

Referring to FIGS. 3 and 4, a description will be given of the operation of the exposure apparatus 1 (an exposure method using the exposure apparatus 1). Here, a description will be given of the exposure of a wafer (the object 40) that spreads resist, as an example. FIG. 3 is a flowchart for explaining operation of the exposure apparatus 1. When plural wafers are continuously processed, a part of operation is processed parallel, in general. In one exposure apparatus 1, if the wafer to which the exposure light is irradiated at the same time is one, operation that stops the irradiation of the ultrasonic wave at the exposure that is point of the instant embodiment can be shown even when plural wafers are continuously processed by the same flowchart.

Referring to FIG. 3, the wafer is carried into the wafer stage 45 by the wafer transfer system (not shown) (step S1002), and the wafer alignment (location of the wafer) is done (step S1004). There is a method of doing a global alignment to reticle 20 after the wafer is pre-aligned to the apparatus standard.

Next, the fluid supply-recovery mechanism 50 supplies the fluid LW to fill between the final optical element at the wafer side of the projection optical system 30 and the wafer (step S1006), and the ultrasonic wave irradiation task starts (step S1008). Actually, the controller 100 (the immersion controller 140) starts the ultrasonic wave irradiation task shown in FIG. 4. In FIG. 3, the loop from step S1008 to step S1018 shows the operation of the step-and-scan manner, and is different from FIG. 4 where only the ultrasonic wave irradiation task is shown. Here, FIG. 4 is a detailed flowchart of an ultrasonic wave irradiation task in Step S1008.

Referring to FIGS. 3 and 4, the ultrasonic wave irradiation task (step S1008) irradiates the ultrasonic wave (step S1011) by turning on the ultrasonic wave irradiation flag (step S1010). Next, the wafer stage 45 (reticle stage 25, because the exposure apparatus 1 is a scanner) is driven to the position of the exposure shot on the wafer (step S1012), and the ultrasonic wave operation flag is turned off (step S1014) before the exposure shot is exposed (step S1016). Thereby, the irradiation of the ultrasonic wave stops (step S1015) when the exposure shot is exposed (step S1016). The step S1010 to step S1016 is done to all the exposure shots, and when the exposure of all the exposure shots is completed (step S1018), the ultrasonic wave irradiation task is ended (step S1020).

After, the fluid LW is recovered (step S1022), the exposure wafer is carried out (step S1024), and the exposure of one wafer ends.

As mentioned above, the exposure apparatus 1 and the exposure method of the instant embodiment can effectively remove the air bubbles that exist in the fluid LW that fills between the final optical element at the wafer side of the projection optical system 30 and the wafer by the ultrasonic wave. In this case, the fluid vibrates by irradiating the ultrasonic wave, however, the deterioration of the transfer accuracy that originates in the removal of the air bubbles can be prevented because it is controlled to stop the irradiation of the ultrasonic wave (in other words, the fluid does not vibrate) when the wafer is exposed. In other words, the vibration of the fluid need not be considered by irradiating the ultrasonic wave when the wafer is not exposed, the vibration and the frequency of the ultrasonic wave can be enlarged by the removal of the air bubbles (in other words, the vibration of fluid may exceed the tolerance), removing more air bubbles in a short time becomes possible. Therefore, the deterioration of the transfer accuracy due to the existence of the air bubbles in the fluid can be prevented.

Figure 5:
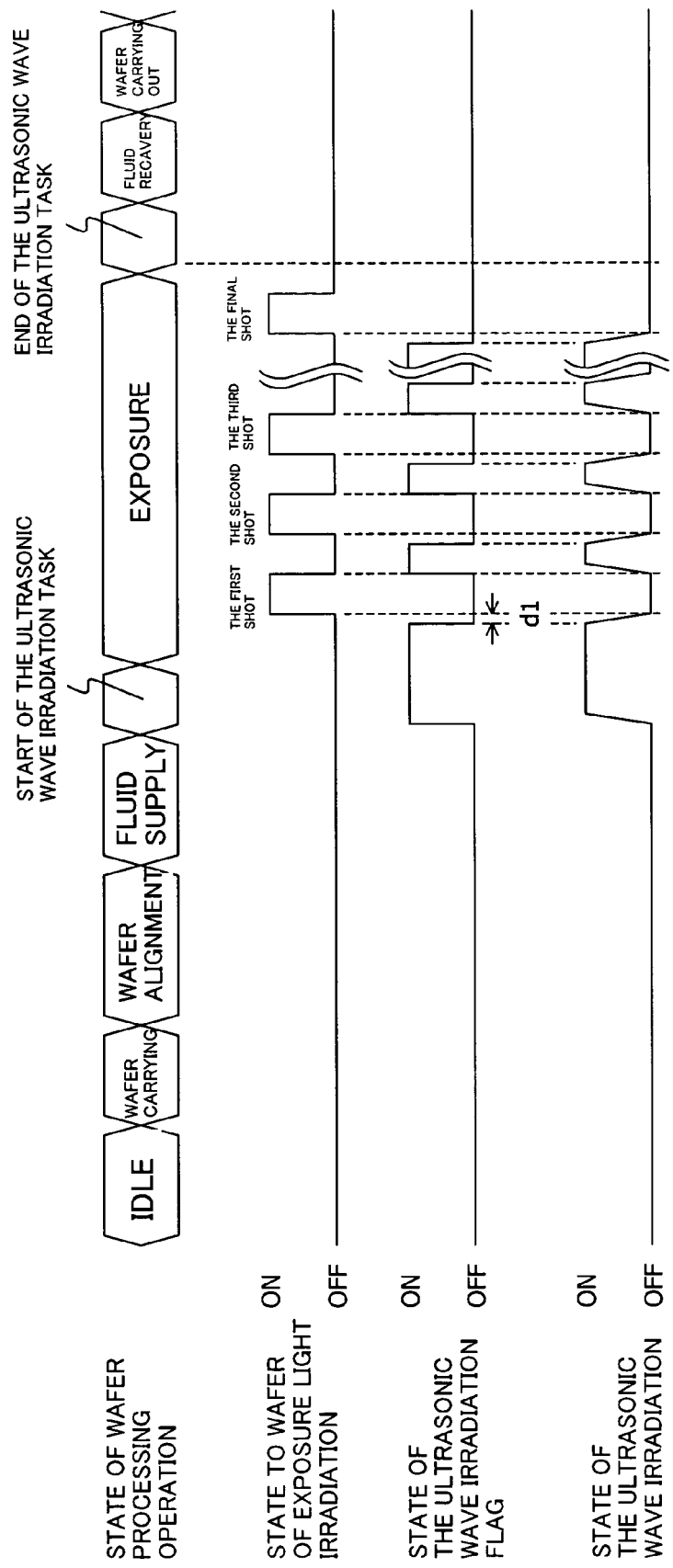
FIG. 5 is a timing chart of operation of the exposure apparatus shown in FIGS. 3 and 4.

FIG. 5 shows the timing chart of the operation of the exposure apparatus 1 shown in FIGS. 3 and 4. Referring to FIG. 5, when the exposure light is irradiated to the wafer (at exposure), the irradiation of the ultrasonic wave is stopped, and when the wafer is not exposed, the ultrasonic wave is irradiated for a long time as much as possible. As a result, the air bubbles that exist in the fluid can be effectively removed. Here, d1 is delay time until the ultrasonic wave irradiation flag is turned off, in other words, until the vibration attenuates to the condition that the vibration of the fluid by the ultrasonic wave irradiation does not influence the exposure (vibrating less than the tolerance of the vibration of the fluid) after it instructs to stop the irradiation of the ultrasonic wave. Therefore, only d1 should turn off the ultrasonic wave irradiation flag before the time for the exposure to start. The instant embodiment is omitted, when it is made to irradiate from the stop of the ultrasonic wave, delay time is similarly caused.

The instant embodiment has decided time to irradiate the ultrasonic wave according to the moving time of the exposure shot decided beforehand. However, the irradiation time of the ultrasonic wave and the throughput of the apparatus are in an inverse relationship of the trade-off, when the effect of removing the air bubbles is higher, the throughput is lower. It gives priority to the irradiation time of the ultrasonic wave, and the interval of the exposure of N shot and the exposure of N+1 shot may decide synchronize during the irradiation time of the ultrasonic wave.

Here, referring to FIGS. 6 and 7, a description will be given of an ultrasonic wave irradiation task (step S1008A) variation of the ultrasonic wave irradiation task of step S1008. The operation of the exposure apparatus 1 (the exposure method using the exposure apparatus 1) is similar to the flowchart shown in FIG. 3. The ultrasonic wave irradiation task of the instant embodiment adjusts the strength of the ultrasonic wave to remove the air bubbles following exposing the wafer and non-exposing the wafer. In detail, when each exposure shot is exposed, the amplitude of the irradiated ultrasonic wave is reduced, and when not exposing it, for instance, moving among the exposure shot (step moving), the amplitude of the irradiated ultrasonic wave is enlarged. In other words, the control to the ultrasonic wave irradiation mechanism 60 of the controller 100 (the immersion controller 140) is different. In the instant embodiment, the controller 100 controls the amplitude of the ultrasonic wave that the ultrasonic wave irradiation mechanism 60 irradiates in three states of 0, small amplitude, and large amplitude.

The fluid LW vibrates by irradiating the ultrasonic wave of small amplitude, however, it is assumed that the vibration is in the tolerance, and deterioration of the transfer accuracy is below tolerance value. In other words, the ultrasonic wave irradiates the fluid LW within the range where deterioration of the transfer accuracy is allowed to achieve the effect of removing the air bubbles that exists in the fluid LW during exposure. The relation between the amplitude of the ultrasonic wave and deterioration of the transfer accuracy is obtained beforehand by the test exposure etc. The amplitude of the irradiated ultrasonic wave can be decided from the relation based on the detection result of the vibration sensor 70.

Figure 6:
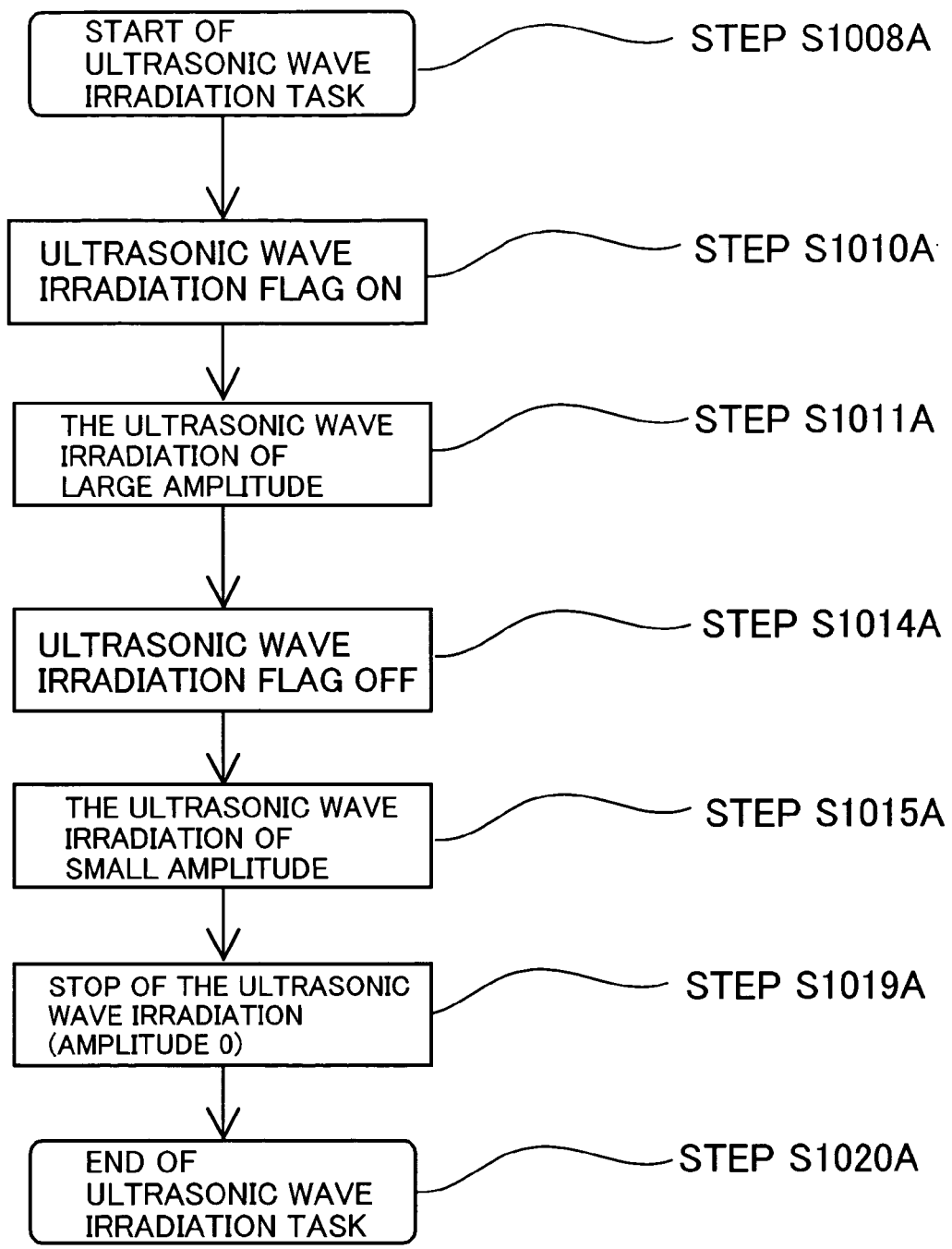
FIG. 6 is a detailed flowchart of a variation of an ultrasonic wave irradiation task of step S1008A shown in FIG. 3.

FIG. 6 is a detailed flowchart of the ultrasonic wave irradiation task as the step S1008A. The ultrasonic wave irradiation task (step S1008A) irradiates the ultrasonic wave of large amplitude (step S1011A) by turning on the ultrasonic wave irradiation flag (step S1010A). At this time, the wafer is non-exposed, for example, the wafer stage 45 is driven to the position of the exposure shot on the wafer (step S1012). When the drive of the wafer stage 45 ends, the ultrasonic wave of small amplitude is irradiated (step S1015A) by turning off the ultrasonic wave irradiation flag (step S1014A). Thereby, the vibration of the fluid LW is within the tolerance when the exposure shot is exposed (step S1016). The step S1010 to step S1016 is done to all the exposure shots, and when the exposure of all the exposure shots is completed (step S1018), the vibration of the ultrasonic wave is adjusted to 0 and the irradiation is stopped (step S1019A), and the ultrasonic wave irradiation task is ended (step S1020A).

As mentioned above, the ultrasonic wave irradiation task of the instant embodiment can irradiate the ultrasonic wave when the wafer is exposed by adjusting the amplitude of the ultrasonic wave, and effectively remove the air bubbles that exist in the fluid that fills between the final optical element at the wafer side of the projection optical system 30 and the wafer. The fluid vibrates by irradiating the ultrasonic wave of small amplitude, however, the deterioration of the transfer accuracy that originates in the removal of the air bubbles can be prevented because the vibration is small enough that it does not influence the transfer accuracy. In other words, when the wafer is non-exposed, the ultrasonic wave of large amplitude is irradiated for the removal of the air bubbles, and when the wafer is exposed, the ultrasonic wave of small amplitude is irradiated which does not influence the transfer accuracy and minimum air bubbles can be removed. Therefore, removing more air bubbles in a short time becomes possible, deterioration of the transfer accuracy because of the existence of the air bubbles in the fluid can be prevented.

Figure 7:
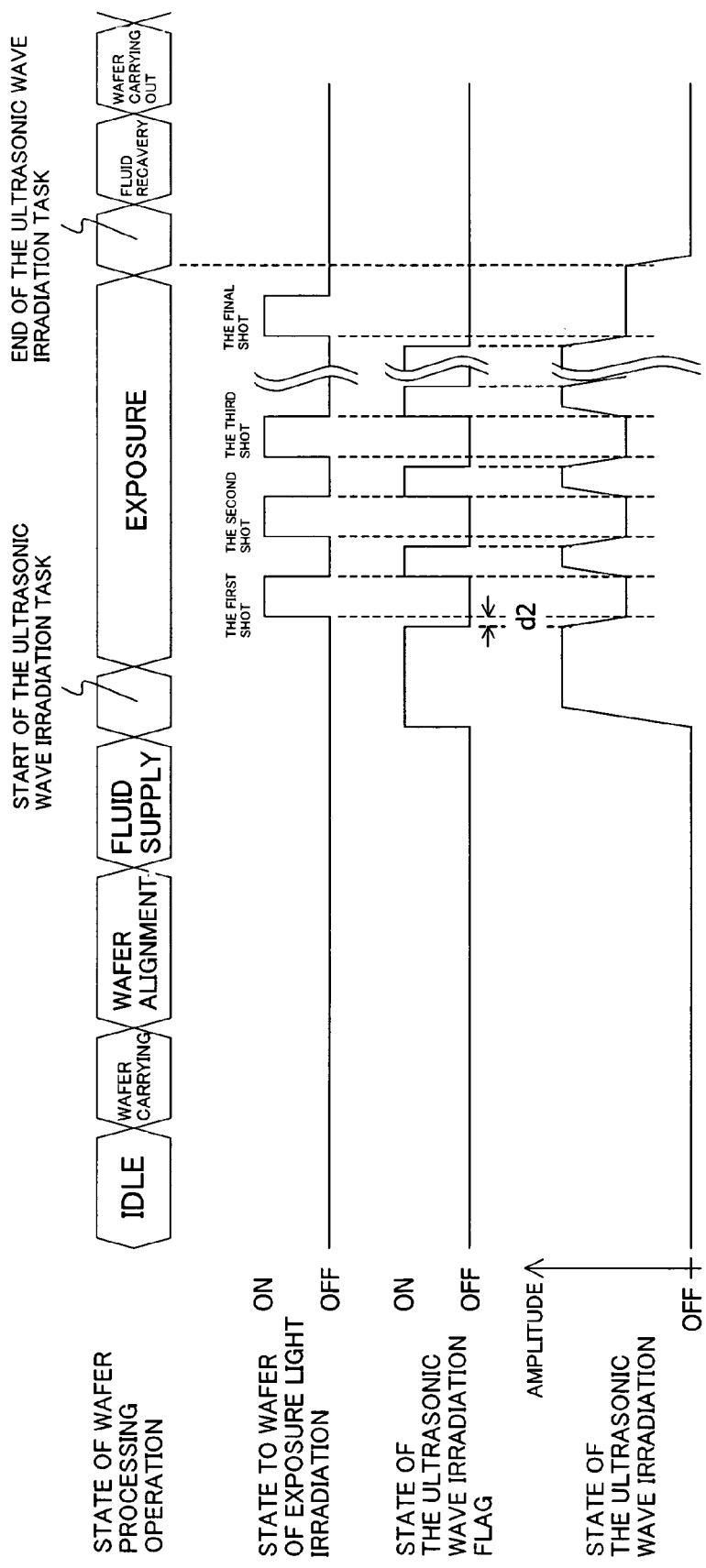
FIG. 7 is a timing chart of operation of the exposure apparatus when the ultrasonic wave irradiation task shown in FIG. 6 is used.

FIG. 7 shows the timing chart of the operation of the exposure apparatus 1 using the ultrasonic wave irradiation task shown in FIG. 6. Referring to FIG. 7, when the exposure light is irradiated to the wafer (at exposure), the ultrasonic wave of small amplitude is irradiated to suppress the deterioration of the transfer accuracy, and when the wafer is non-exposed, the ultrasonic wave of large amplitude is irradiated to effectively remove the air bubbles. Here, d2 is delay time from when the ultrasonic wave irradiation flag is turned off, in other words, the instruction in the irradiation of the ultrasonic wave of small amplitude to when the attenuation condition that the vibration of the fluid by the irradiation of the ultrasonic wave of large amplitude does not influence the exposure (less than the tolerance of the vibration of the fluid). Therefore, only d2 should turn off the ultrasonic wave operation flag early at time for the exposure to start. The instant embodiment is omitted, when it is made to irradiate from the stop of the ultrasonic wave, delay time is similarly caused.

The instant embodiment controls the amplitude of the ultrasonic wave's plural conditions, and may be controlled continuously. In other words, when changing from the ultrasonic wave of small amplitude to the ultrasonic wave of large amplitude and changing from the ultrasonic wave of large amplitude to the ultrasonic wave of small amplitude, the amplitude may be gradually changed.

The ultrasonic wave irradiation task can be applied at the alignment of the reticle 20 and the object 40. When the air bubbles exists in the fluid LW at the alignment of the reticle 20 and the object 40, the detection light irradiated to detect the position of the reticle 20 and the object 40 is diffused by the air bubbles and the detection accuracy (alignment accuracy) of the position of the reticle 20 and the object 40 might be deteriorated. Moreover, if the ultrasonic wave is irradiated to the fluid LW to remove the air bubbles, the fluid LW vibrates, and the detection accuracy (alignment accuracy) is similarly deteriorated.

Then, effectively removing the air bubbles that exist in the fluid is possible by irradiating the ultrasonic wave (or irradiating the ultrasonic wave of large amplitude) before detecting the positions of the reticle 20 and the object 40 and stopping the irradiation of the ultrasonic wave (or irradiating the ultrasonic wave of small amplitude to the extent that does not influence the detection accuracy) when the positions of the reticle 20 and the object 40 are detected, and the deterioration of the detection accuracy (alignment accuracy) that originates in the removal of the air bubbles can be prevented. In other words, the vibration of the fluid need not be considered by irradiating the ultrasonic wave at non-alignment of the reticle 20 and the object 40, the vibration and the frequency of the ultrasonic wave can be enlarged according to the removal of the air bubbles (in other words, the vibration of the fluid may exceed the tolerance), and the deterioration of the alignment accuracy because of the existence of the air bubbles in the fluid can be suppressed. The ultrasonic wave can be irradiated at any time by controlling the amplitude of the irradiated ultrasonic wave regardless of the alignment and non-alignment. Thereby, the air bubbles that exist in the fluid that fills between the final optical element at wafer side of the projection optical system 30 and the wafer can be removed more effectively.

The exposure apparatus 1 removes the air bubbles that exists in the fluid LW and can prevent deterioration of the transfer accuracy that originates in the removal, and achieves the desired resolution. Therefore, the exposure apparatus 1 transfers a pattern to the object 40 with high precision, and provide high-quality devices (such as semiconductor devices, LCD devices, photographing devices (such as CCDs, etc.), thin film magnetic heads, and the like) with high throughput and economic efficiency.

Figure 8:
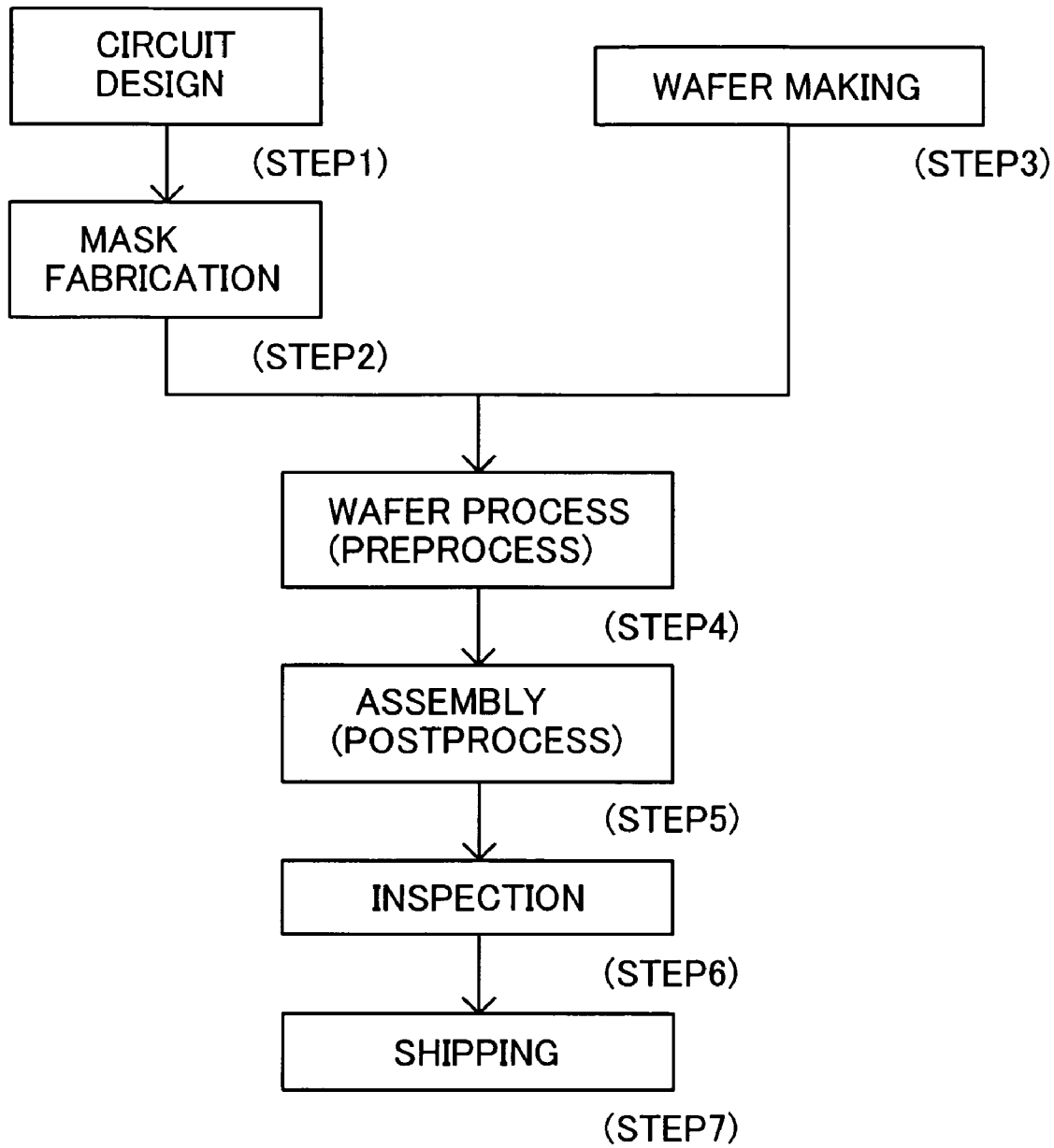
FIG. 8 is a flowchart for explaining how to fabricate devices (such as semiconductor chips such as ICs, LCDs, CCDs, and the like)
Figure 9:
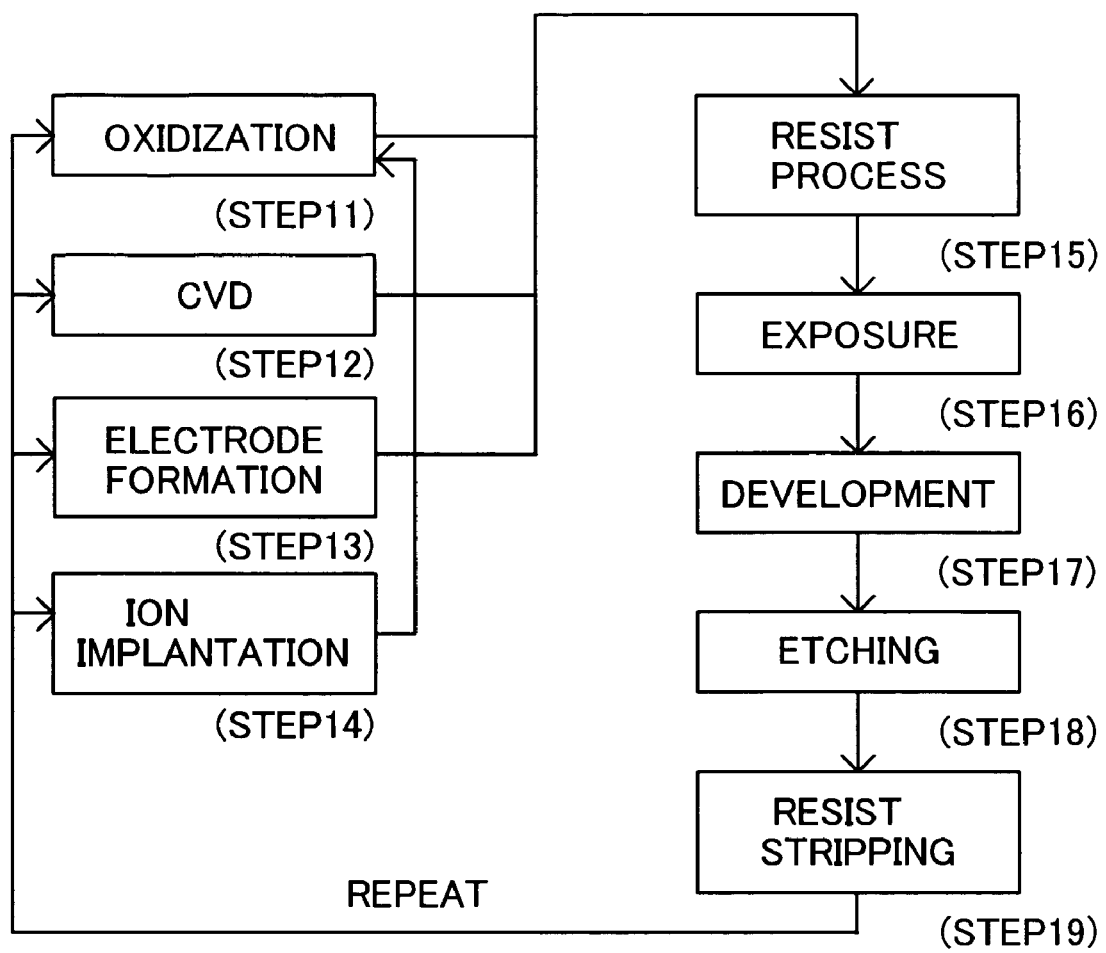
FIG. 9 is a detail flowchart of a wafer process in Step 4 of FIG. 8.

Referring now to FIGS. 8 and 9, a description will be given of an embodiment of a device fabrication method using the above mentioned exposure apparatus 1. FIG. 8 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

Furthermore, the present invention is not limited to these preferred embodiments and various variations and modifications may be made without departing from the scope of the present invention.

This application claims a foreign priority benefit based on Japanese Patent Applications No. 2004-97137, filed on Mar. 29, 2004, which is hereby incorporated by reference herein in its entirety as if fully set forth herein.

What is claimed is:

1. An exposure apparatus comprising:
    a projection optical system for projecting an image of a pattern of a reticle onto an object, via a fluid that is filled in a space between said projection optical system and the object;
    a vibrator part for vibrating at least one of the fluid, the object, and the projection optical system; and
    a controller for controlling the vibrator part,
    wherein said controller sets a different operation mode for the vibrator part during processing of the object and non-processing of the object.

2. An exposure apparatus according to claim 1, wherein said vibrator part irradiates the ultrasonic wave to the fluid.

3. An exposure apparatus according to claim 1, wherein said controller controls at least one of an amplitude and frequency of the vibration.

4. An exposure apparatus according to claim 1, wherein said controller sets a switching time of the operation mode to execute the switching of the operation mode during non-processing of the object.

5. An exposure apparatus according to claim 1, wherein said processing is an exposure.

6. An exposure apparatus according to claim 1, wherein said processing is an alignment of the object and the reticle.

7. An exposure apparatus according to claim 1, further comprising a detector part for detecting at least one of the vibration of the fluid, the object, and the projection optical system.

8. An exposure apparatus according to claim 1, wherein said fluid circulates.

9. A device fabrication method comprising the steps of:
    exposing an object using an exposure apparatus; and
    performing a development process for the object exposed,
    wherein said exposure apparatus includes,
    a projection optical system for projecting an image of a pattern of a reticle onto the object, via a fluid that is filled in a space between said projection optical system and the object;
    a vibrator part for vibrating at least one of the fluid, the object, and the projection optical system; and
    a controller for controlling the vibrator part
    wherein said controller sets a different operation mode for the vibrator part during processing of the object and non-processing of the object.

* * * * *